(12) United States Patent
Matsumoto et al.

(10) Patent No.: US 10,032,727 B2
(45) Date of Patent: Jul. 24, 2018

(54) ELECTRICAL PACKAGE INCLUDING BIMETAL LID

(71) Applicant: INTERNATIONAL BUSINESS MACHINES CORPORATION, Armonk, NY (US)

(72) Inventors: Keiji Matsumoto, Kanagawa-Ken (JP); Hiroyuki Mori, Shiga-Ken (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/950,788

(22) Filed: Nov. 24, 2015

(65) Prior Publication Data

US 2017/0148745 A1    May 25, 2017

(51) Int. Cl.
*H01L 23/14* (2006.01)
*H01L 23/00* (2006.01)
(Continued)

(52) U.S. Cl.
CPC ............ *H01L 23/562* (2013.01); *H01L 23/04* (2013.01); *H01L 23/145* (2013.01); *H01L 23/3185* (2013.01); *H01L 23/3672* (2013.01); *H01L 23/3675* (2013.01); *H01L 23/373* (2013.01); *H01L 23/3733* (2013.01); *H01L 23/3735* (2013.01); *H01L 23/3736* (2013.01); *H01L 23/42* (2013.01); *H01L 23/49816* (2013.01); *H01L 23/49894* (2013.01); *H01L 24/13* (2013.01); *H01L 24/16* (2013.01); *H01L 24/29* (2013.01); *H01L 24/32* (2013.01);
(Continued)

(58) Field of Classification Search
CPC ....... H01L 2924/00; H01L 2924/00014; H01L 2924/10253; H01L 2924/12042; H01L 2924/15311

See application file for complete search history.

(56) References Cited

U.S. PATENT DOCUMENTS 8,952,523 B2    2/2015  Ahmad et al.
9,041,192 B2    5/2015  Saeidi et al.
(Continued)

OTHER PUBLICATIONS

Kanuparthi, S. et al., Impact of Heatsink Attach Loading on FCBGA Package Thermal Performance, 2012 13th IEEE Intersociety Conference on Thermal and Thermornechanical Phenomena in Electronic Systems (ITherm), May 30, 2012, pp. 216-223, IEEE, San Diego, CA, USA <http://amkor.com/index.cfm?objectid=80352186-CFB2-C452-3E488F38188CC617/>.
(Continued)

*Primary Examiner* — Tony Tran
(74) *Attorney, Agent, or Firm* — Vazken Alexanian

(57) ABSTRACT

Electrical package including bimetal lid. The electrical package includes: an organic substrate; a semiconductor chip electrically connected to electrical pads on a surface of the organic substrate via a plurality of solder balls; and a lid for encapsulating the semiconductor chip on the organic substrate, wherein (i) an inner surface of a central part of the lid is connected to a surface of the semiconductor chip via a first TIM, (ii) an inner surface of an outer part of the lid is hermetically connected to the surface of the organic substrate, and (iii) the lid has a bimetal structure including at least two different metals. A circuit module is also provided.

8 Claims, 4 Drawing Sheets

(51) Int. Cl.
*H01L 23/367* (2006.01)
*H01L 23/373* (2006.01)
*H01L 23/31* (2006.01)
*H01L 23/498* (2006.01)
*H01L 23/04* (2006.01)
*H01L 23/42* (2006.01)

(52) U.S. Cl.
CPC .............. *H01L 24/73* (2013.01); *H01L 24/92* (2013.01); *H01L 2224/0401* (2013.01); *H01L 2224/131* (2013.01); *H01L 2224/13082* (2013.01); *H01L 2224/13147* (2013.01); *H01L 2224/16227* (2013.01); *H01L 2224/2929* (2013.01); *H01L 2224/29191* (2013.01); *H01L 2224/29193* (2013.01); *H01L 2224/29298* (2013.01); *H01L 2224/32225* (2013.01); *H01L 2224/32245* (2013.01); *H01L 2224/73204* (2013.01); *H01L 2224/73253* (2013.01); *H01L 2224/92125* (2013.01); *H01L 2924/10253* (2013.01); *H01L 2924/14* (2013.01); *H01L 2924/15311* (2013.01); *H01L 2924/1659* (2013.01); *H01L 2924/16172* (2013.01); *H01L 2924/16251* (2013.01); *H01L 2924/16747* (2013.01); *H01L 2924/3511* (2013.01)

(56) References Cited

U.S. PATENT DOCUMENTS

| | | |
|---|---|---|
| 9,054,023 B1 | 6/2015 | Kang |
| 9,337,124 B1* | 5/2016 | Herrault .............. H01L 23/3736 |
| 2012/0043668 A1* | 2/2012 | Refai-Ahmed ......... H01L 23/04 |
| | | 257/777 |
| 2013/0341784 A1* | 12/2013 | Lin ........................ H01L 21/56 |
| | | 257/737 |
| 2015/0021754 A1 | 1/2015 | Lin et al. |
| 2015/0194389 A1 | 7/2015 | Yew et al. |

OTHER PUBLICATIONS

Galloway, J. et al., Thermal Performance of FCMBGA: Exposed Molded Die Compared to Lidded Package, 2011 27th Annual IEEE Semiconductor Thermal Measurement and Management Symposium (SEMI-THERM), Mar. 20, 2011, pp. 181-186, IEEE, San Jose, CA, USA <http://ieeexplore.ieee.org/xpl/articleDetails.jsp?arnumber=5767197/>.

* cited by examiner

Table 1

| Metal | CTE (ppm) | Thermal conductivity (W/mK) |
|---|---|---|
| Cu | 16.6 | 398 |
| CrCu | 15.9~16.6 | 300~340 |
| ZrCu | 16.0~16.6 | 300~380 |
| W | 4.5 | 173 |
| Mo | 5.1 | 138 |
| Al | 23.7 | 237 |
| Zn | 53 | 121 |
| Be | 15.0 | 200 |
| Ni | 15.0 | 91 |

ELECTRICAL PACKAGE INCLUDING BIMETAL LID

TECHNICAL FIELD OF THE INVENTION

The present invention relates to an electrical package, and more specifically, to an electrical package that includes a bimetal lid for reducing delamination of a thermal interface material (hereinafter, "TIM") occurring from thermal stress.

BACKGROUND OF THE INVENTION

FIG. 1 shows an example of a conventional electrical package for high-end servers. Electrical package 10 includes organic substrate 1, semiconductor chip 2 electrically connected to the organic substrate using a plurality of solder balls (bumps) 3, lid 4 for encapsulating semiconductor chip 2 on organic substrate 1.

In FIG. 1, the inner surface of the central part of lid 4 is connected to the surface of semiconductor chip 2 via TIM 5. The inner surface of the outer part of lid 4 is hermetically connected to the surface of organic substrate 1 using sealing materials 6. Further, underfill 7 is formed between semiconductor chip 2 and the surface of organic substrate 1.

Since the coefficient of thermal expansion (CTE) of each component in package 10 is different, thermo-mechanical stress occurs within package 10, and also warpage of organic substrate 1 occurs during the thermal cycle/stress. As a result, delamination of TIM 5 tends to occur, especially in corner part 8. When the TIM delamination occurs, the temperature of semiconductor chip 2 increases because of insufficient cooling performance, and semiconductor chip 2 may not operate properly.

Therefore it is necessary to reduce the TIM delamination occurred under the thermal cycle/stress in order to maintain the semiconductor chip performance/reliability.

SUMMARY OF THE INVENTION

The present invention provides an electrical package which includes: an organic substrate; a semiconductor chip electrically connected to electrical pads on a surface of the organic substrate via a plurality of solder balls; and a lid for encapsulating the semiconductor chip on the organic substrate. In the electrical package, an inner surface of a central part of the lid is connected to a surface of the semiconductor chip via a first TIM, an inner surface of an outer part of the lid is hermetically connected to the surface of the organic substrate, and the lid has a bimetal structure including at least two different metals.

The present invention also provides a circuit module. The circuit modules includes: at least one electrical package mounted on a circuit board using ball grid array (BGA).

DETAILED DESCRIPTION OF THE PREFERRED EMBODIMENTS

Through the more detailed description of some embodiments of the present invention in the accompanying drawings, the above and other objects, features and advantages of the present invention will become more apparent, wherein the same reference generally refers to the same components in the embodiments of the present invention.

Figure 1:
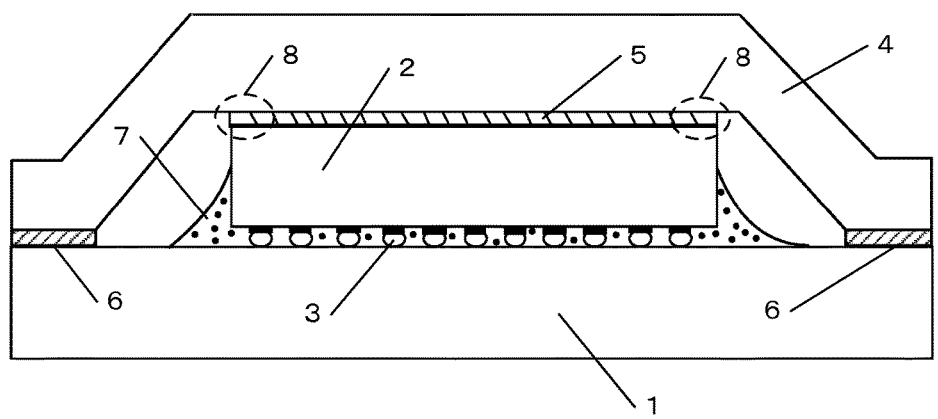
FIG. 1 is a cross-sectional diagram of a conventional electrical package for high-end servers.
Figure 2:
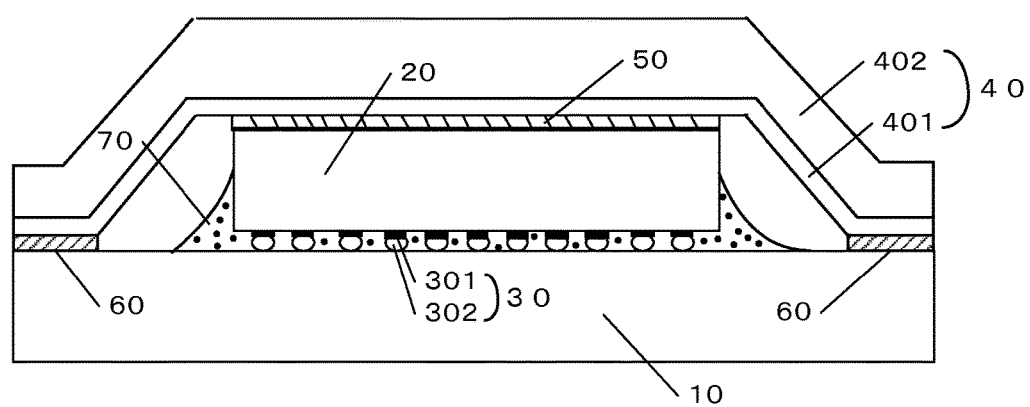
FIG. 2 is a cross-sectional diagram of the electrical package of one embodiment of the present invention.

Referring to FIG. 2, a cross-sectional diagram of an electrical package of one embodiment of the present invention is shown. Electrical package 100 includes organic substrate 10, semiconductor chip 20 electrically connected to the organic substrate 10 using a plurality of solder balls (bumps) 30, lid 40 for encapsulating semiconductor chip 20 on organic substrate 10. Each bump 30 contains metal (e.g., Cu) pillar 301 and solder ball 302. Lid 40 is also called a thermal spreader. Lid 40 has a bimetal structure including at least two different metals. In FIG. 1, lid 40 consists of two metal layers 401, 402.

Inner surface 401 of the central part of lid 40 is connected to the surface of semiconductor chip 20 via TIM 50. TIM 50 can include: silicone grease, heat conduction sheet, or perpendicular orientation carbon nanotube (CNT). Inner surface 401 of the outer part of lid 40 is hermetically connected to the surface of organic substrate 10 using sealing materials 60. Sealing materials 60 can include thermosetting resin. Further, underfill 70 is formed between semiconductor chip 20 and the surface of organic substrate 10. Underfill 70 can include epoxy resin with fillers.

Figure 3:
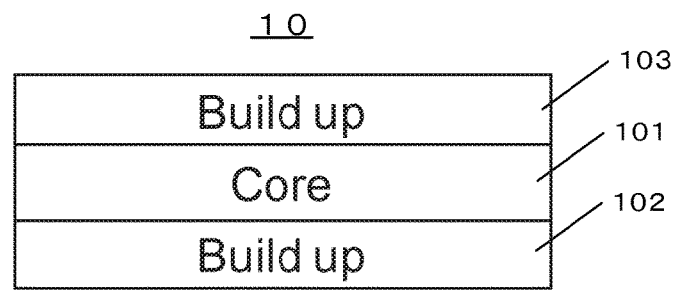
FIG. 3 is a cross-sectional diagram of the organic substrate of one embodiment of the present invention.

FIG. 3 shows an example of a cross section of organic substrate 10. Organic substrate 10 includes core layer 101 which is sandwiched by two buildup layers 102, 103. Core layer 101 includes organic materials and a plurality of conductive vias to electrically connect between buildup layers 102, 103. Core layer 101 further includes metal layers and composite layers with dielectric materials enclosing glass fiber cloth. Buildup layers 102, 103 include a plurality of wiring layers and dielectric layers. The wiring layers include patterned metal layer in a dielectric material. The dielectric layers are in between the wiring layers.

The semiconductor chip 20 may include a silicon chip or other semiconductor chip such as IC, LSI, VLSI, or MPU. The material of the semiconductor chip is not limited to specific types. Lid 40 of electronic package 100 has bimetal structure 401,402 (shown in FIG. 2) so that lid 40 is transformed to follow warpage of organic substrate 10 under the thermal stress/cycle. In other words, the lid's warpage is dependent on the temperature in the thermal cycle/stress. For example, lid 40 bends into the upper part when organic substrate 10 bends into the upper part. On the contrary, lid 40 bends into the bottom when organic substrate 10 bends into the bottom. As a result, stress to TIM 50 decreases and the TIM delamination can be reduced, especially delamination at the edge of TIM 50.

Metal layers 401, 402 of lid 40 may be made of a combination of Copper (Cu) 401 and Cu alloy 402. Cu alloy 402 may include Chromium Copper (CuCr) or Zirconium Copper (ZrCu) because CuCr and ZrCu have high thermal conductivity as shown in Table 1 of FIG. 8. Also, Tungsten (W) and Nickel (Ni) are usable for metal layer 402. Further, other candidate metals may be selected from Table 1 of FIG. 8.

Figure 4:
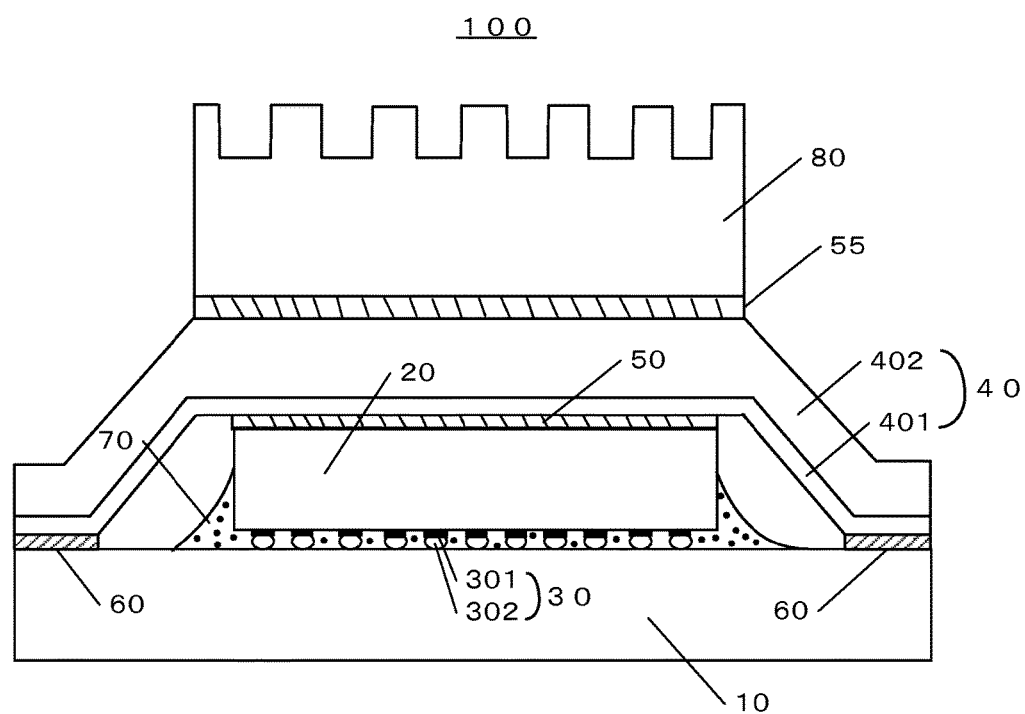
FIG. 4 is a cross-sectional diagram of the electrical package of one embodiment of the present invention.

FIG. 4 shows a cross-sectional diagram of other electrical package of one embodiment of the present invention. In FIG. 4, electrical package 100 further includes cooling module 80 formed on lid 40 (402) via TIM 55. TIM 55 may include silicone grease, heat conduction sheet, or perpendicular orientation CNT. Other constitution in FIG. 4 is the same as constitution of FIG. 2. Cooling module 80 is used to let heat generation of semiconductor chip 20 go to the outside of the electrical package 100. For example, cooling module 80 may include a heat sink. The warpage of the top surface of lid 40 (402) may be larger than conventional lid 4 consisted of Cu in FIG. 1. However, if TIM 55 is thicker than TIM 50, it is considered that the large warpage of the top surface of lid 40 (402) can be managed by the thick TIM 55.

Figure 5:
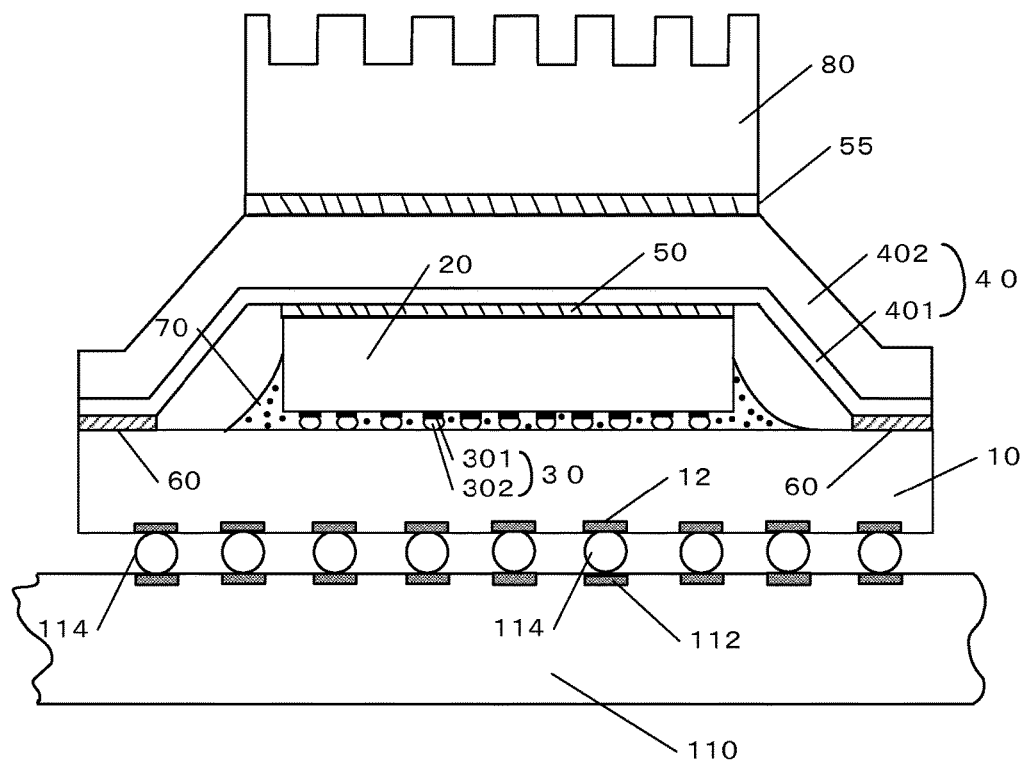
FIG. 5 is a cross-sectional diagram of the circuit module of one embodiment of the present invention.

FIG. 5 shows a cross-sectional diagram of a circuit module of one embodiment of the present invention. Circuit module 200 is an example of a circuit module using electrical package 100. In FIG. 5, electrical package 100 is mounted on circuit board 110. Circuit board 100 is also called a mother board. For example, circuit board 100 may include a printed circuit board (PCB). Electrical pads 12 on the surface of organic substrate 10 of electrical package 100 are connected with electrical pads 112 on the surface of circuit board 110 using ball grid array (BGA) 114.

Figure 6:
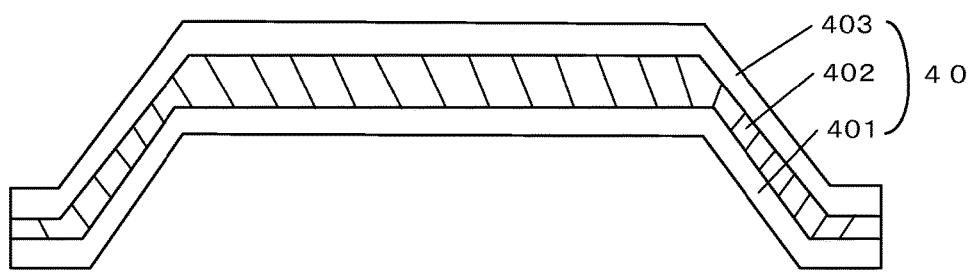
FIG. 6 is a cross-sectional diagram of the lid of one embodiment of the present invention.

FIG. 6 shows a cross-sectional diagram of the other lid of one embodiment of the present invention. Lid 40 has three metal layers 401, 402, 403. Metal layer 402 is sandwiched by metal layers 401, 403. For example, metal layer 402 includes Cu alloy such as CuCr or ZrCu and metal layers 401, 403 include Cu. The bimetal structure of lid 40 shown in FIGS. 2-6 may be formed by the conventional metal rolling process. The metal rolling process is a metal forming process in which metal stock is passed through one or more pairs of rolls to reduce the thickness and to make the thickness uniform of the metal stock.

Figures 7, 8:
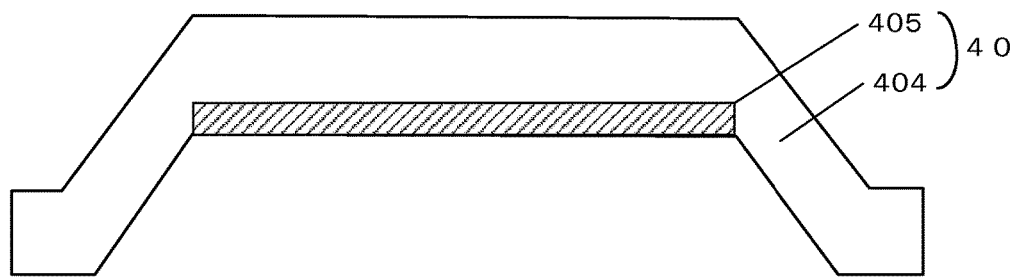
FIG. 7 is a cross-sectional diagram of the lid of one embodiment of the present invention.
FIG. 8 shows a table of candidate metals available for the bimetal structure of the lid of one embodiment of the present invention.

FIG. 7 is a cross-sectional diagram of the other lid of one embodiment of the present invention. Lid 40 has two metal layers 404, 405. Metal layer 405 is only formed in the central part of lid 40 parallel to the surface of semiconductor chip 20. Metal layer 405 is formed to cover at least the area over the surface of semiconductor chip 20. Metal layer 405 includes CuCr, ZrCu, W, or Ni and metal layer 404 includes Cu.

The embodiment of the present invention has been described with reference to the accompanying drawings. However, the present invention is not limited to the embodiment. The present invention can be carried out in forms to which various improvements, corrections, and modifications are added based on the knowledge of those skilled in the art without departing from the purpose of the present invention.

What is claimed is:

1. An electrical package, comprising:
   an organic substrate;
   a semiconductor chip electrically connected to electrical pads on a surface of the organic substrate via a plurality of solder balls; and
   a three-layer lid for encapsulating the semiconductor chip on the organic substrate having a first Copper (Cu) metal layer, a second Copper (Cu) metal layer and a Copper alloy metal layer, wherein the Copper alloy metal is selected from a group consisting of: Chromium Copper (CuCr), Zirconium Copper (ZrCu), and a combination thereof; and wherein the Copper alloy metal layer is sandwiched by the first Copper metal layer and the second Copper metal layer; and
   a cooling module formed on the three-layer lid via a second TIM that is thicker than the first TIM;
   wherein:
   (i) an inner surface of a central part of the first Copper metal layer of the lid is connected to a surface of the semiconductor chip via a first thermal interface material (TIM), wherein the first TIM is not the first Copper metal layer, the Copper alloy metal layer or the second Copper metal layer;
   (ii) an inner surface of an outer part of the second Copper metal layer of the lid is hermetically connected to the surface of the organic substrate; and
   (iii) the first copper layer and the second copper layer are the same length and width and cover the same area.

2. The electrical package according to claim 1, wherein the cooling module comprises a heat sink.

3. The electrical package according to claim 1, wherein the first and the second TIM comprise silicon or polymer resin containing conductive fillers.

4. The electrical package according to claim 1, further comprising: an underfill formed between the semiconductor chip and the surface of the organic substrate.

5. The electrical package according to claim 1, wherein the inner surface of the outer part of the second metal layer of the three-layer lid is hermetically connected to the surface of the organic substrate using sealing materials.

6. The electrical package according to claim 1, wherein the organic substrate comprises a core layer sandwiched by two buildup layers.

7. The electrical package according to claim 6, wherein the core layer comprises organic materials and a plurality of conductive vias to electrically connect between the two buildup layers.

8. The electrical package according to claim 7, wherein the buildup layers comprise a plurality of wiring layers and dielectric layers.

* * * * *